United States Patent [19]

Osada et al.

[11] Patent Number: 4,921,722
[45] Date of Patent: May 1, 1990

[54] METHOD FOR FORMING DEPOSITED FILM

[75] Inventors: Yoshiyuki Osada, Yokosuka; Hisanori Tsuda, Atsugi; Masafumi Sano, Kawasaki; Satoshi Omata, Tokyo; Katsuji Takasu, Asaka; Yutaka Hirai, Tokyo, all of Japan

[73] Assignee: Canon Kabushiki Kaisha, Tokyo, Japan

[21] Appl. No.: 786,700

[22] Filed: Oct. 11, 1985

[30] Foreign Application Priority Data

Oct. 11, 1984 [JP] Japan .................... 59-211460

[51] Int. Cl.$^5$ .................................... B05D 3/06
[52] U.S. Cl. .................... 427/39; 427/53.1; 427/54.1; 427/74; 427/234; 427/235
[58] Field of Search .......... 427/81, 39, 74, 53.1, 427/54.1, 36, 234, 235

[56] References Cited

U.S. PATENT DOCUMENTS

| | | | |
|---|---|---|---|
| 4,448,801 | 5/1984 | Fukuda | 427/86 |
| 4,459,163 | 7/1984 | MacDiarmid | 427/86 |
| 4,532,199 | 7/1985 | Ueno | 427/86 |
| 4,544,423 | 10/1985 | Tsuge | 427/86 |
| 4,546,008 | 10/1985 | Saitoh | 427/86 |
| 4,569,855 | 2/1986 | Matsuda | 427/53.1 |
| 4,585,671 | 4/1986 | Kitagawa | 427/53.1 |
| 4,657,777 | 4/1987 | Hirooka | 427/38 |
| 4,759,947 | 7/1988 | Ishihara et al. | 427/53.1 |

FOREIGN PATENT DOCUMENTS 59-104471  6/1984  Japan .................... 427/86

Primary Examiner—Janyce Bell
Attorney, Agent, or Firm—Fitzpatrick, Cella, Harper & Scinto

[57] ABSTRACT

A method for forming a deposited film by forming a gaseous atmosphere of a hydrogenated silicon compound of the general formula $Si_nH_m$ wherein n is an integer of 1 or more, and m is an integer of 2 or more in a chamber housing a substrate therein and forming a deposited film containing silicon on said substrate by excitation of said compound to effect decomposition or polymerization thereof comprises introducing a gaseous radical polymerization initiator into said chamber and utilizing light energy, thereby exciting said compound to effect decomposition or polymerization thereof.

5 Claims, 1 Drawing Sheet

METHOD FOR FORMING DEPOSITED FILM

BACKGROUND OF THE INVENTION

1. Field of the Invention

This invention relates to a method suitable for forming a deposited film containing silicon, above all a non-single crystalline deposited film such as amorphous silicon (hereinafter called a-Si) or polycrystalline silicon useful as photoconductive film, semiconductor film or insulating film, etc.

2. Description of the Prior Art

In the prior art, as the method for forming a-Si deposited film by use of $SiH_4$ or $Si_2H_6$ as the starting material, there have been known the glow discharging deposition method and the heat energy deposition method. That is, they are the methods in which deposited films of a-Si are formed on the substrate by excitation-decomposition or polymerization of $SiH_4$ or $Si_2H_6$ by use of electric energy or thermal energy. Also, these films have been utilized for various purposes.

However, when $SiH_4$ or $Si_2H_6$ is used as the starting material, the influence of the discharged energy on the film during deposition under high power in the glow discharging method is great, whereby control under reproducible stable conditions can be performed only with difficulty. This is particularly the case when forming a thick deposited film with a broad area.

Also, in the heat energy deposition method, since a high temperature is required, the choice of substrate to be employed is limited. Further, the probability of elimination of the useful hydrogen atoms bonded in a-Si will be increased at high temperature, whereby desired characteristics are obtained only with difficulty.

Thus, when forming a deposited film by use of $SiH_4$ or $Si_2H_6$, it is difficult to ensure uniform electrical and optical characteristics as well as stability of the quality. Also under the present situation, there remain problems to be solved such as easy formation of surface disturbance of the film during deposition or defect within the bulk, etc.

Accordingly, in recent years, in order to cancel these problems, a light energy deposition method (light CVD method) employing $SiH_4$ or $Si_2H_6$ has been proposed and is attracting attention. According to such a light energy deposition method, due to the advantage that an a-Si deposited film can be prepared at low temperature, the above problems can be improved to a great extent.

However, according to such a light energy deposition method wherein $SiH_4$ or $Si_2H_6$ is used as the starting material under relatively small excitation energy such as light energy, no decomposition or polymerization with dramatically improved efficiency can be expected. Therefore, no improvement in film forming speed can be expected, thus posing a new problem of low bulk productivity.

The present invention has been made to cancel these problems under the present situation.

SUMMARY OF THE INVENTION

It is, therefore, an object of the present invention to provide a method for forming a deposited film capable of preparing a silicon deposited film of high quality by enhancing the film forming speed while maintaining high quality and also ensuring uniform electrical and optical characteristics as well as stability of quality even in those cases where a thick deposited film having a broad area is to be prepared.

According to the present invention, there is provided a method for forming a deposited film by forming a gaseous atmosphere of a hydrogenated silicon compound of the general formula $Si_nH_m$ (wherein n is an integer of 1 or more, and m an integer of 2 or more) in a chamber housing a substrate therein and forming a deposited film containing silicon on the substrate by excitation of the compound to effect decomposition or polymerization thereof, which comprises introducing a gaseous radical polymerization initiator into the chamber and at the same time utilizing light energy, thereby exciting the compound to effect decomposition or polymerization thereof.

BRIEF DESCRIPTION OF THE DRAWING

In the drawing, the single FIGURE is a schematic illustration of the constitution showing an example of the light energy irradiating type device for forming a deposited film for realizing an embodiment of the method for forming a deposited film according to the present invention.

DESCRIPTION OF THE PREFERRED EMBODIMENTS

Figure 1:
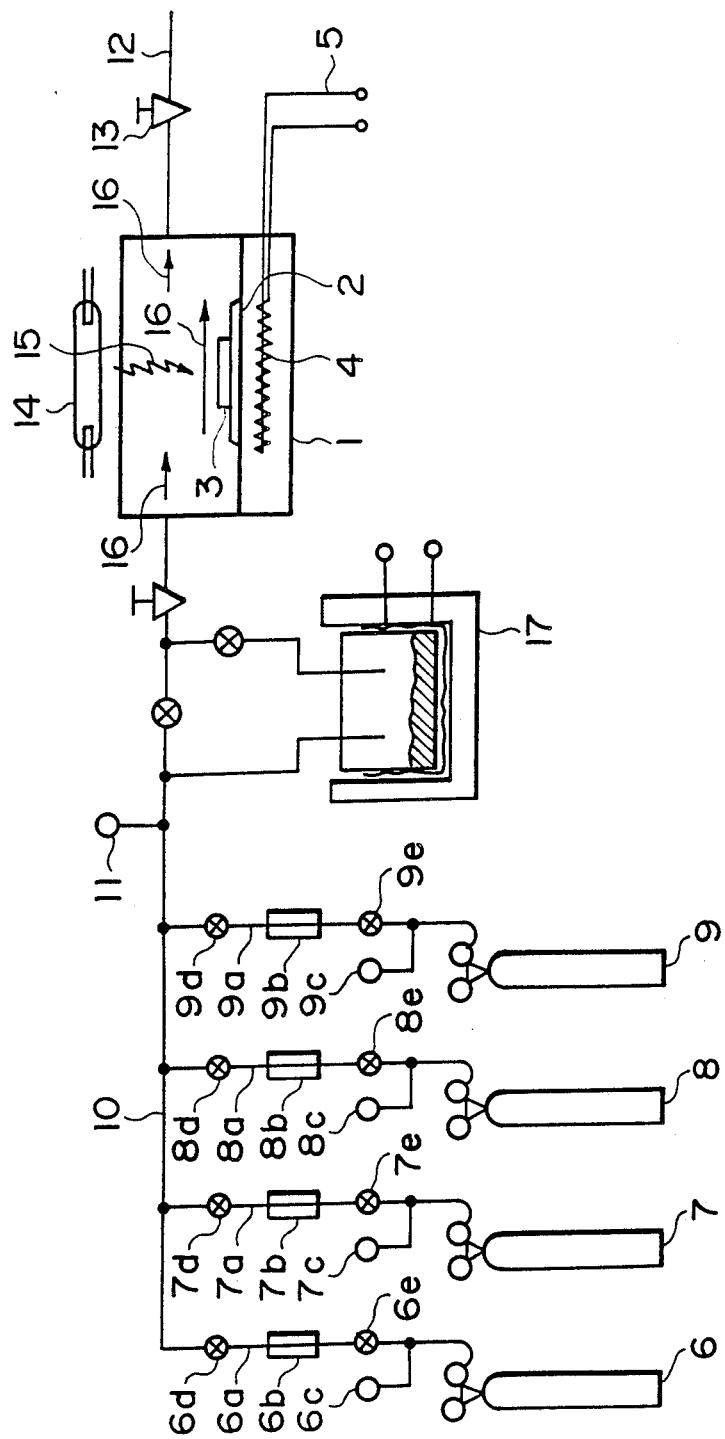

The deposited film containing silicon formed according to the method of the present invention may be either crystalline or amorphous, and the bondings of silicon in the film may be either in the form from an oligomer to a polymer. Also, hydrogen atoms, halogen atoms, etc. in the starting materials may be incorporated in its structure.

In the following, the embodiments of the present invention will be described by referring primarily to a-Si deposited films.

In the present invention, chain hydrogenated silicon compounds having single bond or multiple bond represented by the general formula $Si_nH_m$ (wherein n is an integer of 1 or more and m is an integer of 2 or more) or cyclic hydrogenated silicon compounds having single bond or multiple bond represented by the general formula $Si_{n'}H_{m'}$ (wherein n' is an integer of 3 or more and m' is an integer of 4 or more) may be used. Particularly, of the chain hydrogenated silicon compounds, those having double bond(s) or triple bond(s) with n=2, 3, or 4 are preferred, while of the cyclic hydrogenated silicon compounds, those with n'=3, 4 or 7 are preferred.

In the present invention, into the above chain or cyclic hydrogenated silicon compound which has been made gaseous, a radical polymerization initiator made gaseous is introduced.

As the radical polymerization initiator, there may preferably be employed azo compounds, peroxides or halogen compounds.

Typical azo compounds employed in the invention include 2,2'-azobisisobutyronitrile, dimethyl 2,2'-azoisobutyrate, diazoaminobenzene and 1,1'-azobis-1-cyclohexanenitrile.

As peroxides, it is possible to use hydrogen peroxide, organic peroxides such as a hydroperoxide R—OOH (R', R'— will hereinafter represent alkyl or phenyl), a dialkyl peroxide R—OO—R, a diacyl peroxide (R—COO)$_2$, an ester peroxide R—COO—R, etc. Examples of the peroxides useful in this invention include di-tert-butyl peroxide and benzoyl peroxide.

Useful halogen compounds include, for example carbon tetrachloride, boron trifluoride and perchloric acid.

Particularly, carbon tetrachloride, benzoyl peroxide and di-tertiary-butyl peroxide are preferred.

When such a radical polymerization initiator is introduced under gaseous state, the radical forming reaction will occur between the initiator and the Si and H of the hydrogenated silicon compound, whereby excitation, decomposition or polymerization of the hydrogenated silicon compound will actively occur to promote formation of the deposited film.

Also, the halogen or carbon compounds will be incorporated into the deposited film formed to reduce the defects of the structure, and among others, the halogen will be combined with the dangling bonds of Si to act as terminator, whereby a silicon film of good quality may be expected to be obtained.

The above chamber for forming the deposited film containing silicon in the present invention may preferably be placed under a reduced pressure, but it is also possible to practice the method of the present invention either under normal pressure or under pressurization.

In the present invention, the excitation energy to be used for excitation-decomposition or polymerization of the chain hydrogenated silicon compound of the above formula is limited to light energy. The cyclic hydrogenated silicon compound of the above formula can be readily excited and decomposed or polymerized to form a silicon deposited film of good quality by applying light energy or comparatively low heat energy, and also has the specific feature that the temperature of the substrate can be relatively low. Also, the excitation energy can be imparted uniformly or selectively to the starting material which has reached the vicinity of the substrate. Further, use of light energy is advantageous, since it will enable formation of a deposited film by irradiation over the whole substrate by use of an appropriate optical system, or formation partially of a deposited film by selective irradiation over only the desired portion, and it can also form conveniently a deposited film by irradiation of only the desired pattern portion by use of a resist, etc.

As the hydrogenated silicon compound of the above formula, two or more kinds of compounds may be used. In this case, the characteristics may be an average expected from the film characteristics of the respective compounds or may be synergetically.

Referring now to the drawing, an embodiment of the present invention is to be described in detail.

The drawing is a schematic illustration of the constitution of an example of the light energy irradiation type device for forming a deposited film to be used for the embodiment of the method of the present invention.

In the drawing, 1 is a deposition chamber, in which a desired substrate 3 is set on a substrate supporting stand 2. The substrate 3 may be electroconductive, semiconductive or insulating. For example, as insulating substrates, there may generally be used films or sheets of synthetic resins such as polyester, polyethylene, polycarbonate, cellulose acetate, polypropylene, polyvinyl chloride, polyvinylidene chloride, polystyrene, polyamide, etc. or glass, ceramic, paper, etc. Also, the substrate 3 may previously be laminated with an electrode layer, or other silicon layers, etc.

4 is a heater for heating the substrate, supplied with electricity through the conductive wire 5 to generate heat. The substrate temperature is not particularly limited, but in the case where the substrate is to be heated in practicing the method of the present invention, it should preferably be 50° to 150° C., more preferably 100° to 150° C.

6–9 are gas feeding sources and, when a liquid hydrogenated silicon compound of the above formula is to be employed, an appropriate gasifying device is used. The gasifying device may include any of the type utilizing heat boiling, the type of passing a carrier gas into the liquid starting material, etc. The number of the gas feeding sources is not limited to 4, but it may be appropriately selected depending on the number of the chain hydrogenated silicon compounds of the above formula or, in the case of employing a carrier gas, a diluting gas or a catalyst gas, corresponding to the presence of preliminary mixing with the above compound which is the starting gas. In the drawing, of the symbols of the gas feeding sources 6–9, those affixed with a are branched pipes, those affixed with b are flow meters, those affixed with c are pressure gauges for measuring the pressure on the higher pressure side of the respective flow meters, and those affixed with d or e are valves for controlling opening-closing and flow rates of the respective gas streams.

The starting gas, etc. fed from the respective gas feeding sources are mixed in the course of the gas inlet tube 10, and enforced with a ventilation device (not shown) to be introduced into the chamber 1. 11 is a pressure gauge for measuring the pressure of the gas introduced into the chamber. And, 12 is a gas discharging pipe, which is connected to an evacuation device (not shown) for reducing the pressure in the deposition chamber 1 or forcibly discharging the introduced gas.

13 is a regulator valve. When the chamber 1 is internally evacuated to a reduced pressure before introduction of the starting gas, etc., the pressure in the chamber should preferably be $5 \times 10^{-5}$ Torr or less, more preferably $1 \times 10^{-6}$ Torr or less. Also, under the state where the starting gas is introduced, the pressure in the chamber 1 should preferably be $1 \times 10^{-2}$ to 100 Torr, more preferably $1 \times 10^{-2}$ to 1 Torr.

17 is an initiator vaporizer, which vaporizes a radical polymerization initiator by heating under reduced pressure or heating under normal pressure. Of course, an initiator with low vapor pressure will not require such a device.

As an example of the excitation energy supplying source to be used in the present invention, 14 is a light energy emitting device, for example, a mercury lamp, a xenon lamp, carbon dioxide laser, argon ion laser, excimer laser, etc. The light energy to be used in the present invention is not limited to UV-ray energy, but it is possible to use any light energy irrespective of its wavelength region, provided that it can excite and decompose or polymerize the gas of a radical polymerization initiator and the starting gas to deposit a decomposed product. Also, the case where light energy is absorbed by the gas of a radical polymerization initiator and the starting gas or the substrate and is converted to heat energy, by which heat energy excitation and decomposition or polymerization of the gas of a radical polymerization initiator and the starting gas are brought about to form the deposited film, is not excluded. The light 15 directed to the whole substrate or a desired portion of the substrate by means of an appropriate optical system from the light energy emitting source is irradiated on the gas of a radical polymerization initiator and the starting gas, etc. flowing in the direction of the arrowhead 16 to cause excitation and decomposition or polymerization, thereby forming a deposited film on the whole or a desired portion of the substrate 3.

Thus, a deposited film with any desired film thickness from thin film to thick film can be formed, and the film area may also be selected as desired. The film thickness may be controlled in a conventional manner by controlling the pressure, flow rate, concentration, etc. of the gas of a radical polymerization initiator, controlling the pressure, flow rate, concentration, etc. of the starting gas or controlling the excitation energy quantity, etc. For example, when preparing an a-Si film constituting a photoconductive film, a semiconductor film or an insulating film, etc., the film thickness should preferably be 500 to 50,000 Å, more preferably 1000 to 10,000 Å.

In the following, an example of the present invention is shown.

As the chain hydrogenated silicon compound of the above formula, $H_2Si:SiH_2$ was used and $CCl_4$ was used as the radical polymerization initiator to form an a-Si deposited film.

First, a polyethyleneterephthalate film substrate was mounted on the support 2, followed by evacuation of the deposition chamber 1 by means of a ventilation device to reduce the pressure to $10^{-6}$ Torr. Next, the substrate temperature was adjusted to 80° C., and the above unsaturated hydrogenated silicon compound brought to gaseous state was introduced at a flow rate of 150 SCCM and the gas of the radical polymerization initiator at 20 SCCM into the deposition chamber 1. While maintaining the pressure in the chamber at 0.1 Torr, the irradiation was effected by a 1 KW Xe lamp 14 vertically on the substrate 3 to form an i-type a-Si film with a thickness of 5000 Å. The film forming speed was 40 Å/sec.

For comparison, a-Si film was formed similarly with only $Si_2H_4$, using no radical polymerization initiator, and the film forming speed was 25 Å/sec.

Subsequently, the respective samples of a-Si films thus prepared were placed in a vapor deposition tank and, after reducing the pressure to $10^{-6}$ Torr, aluminum was vapor deposited to a thickness of 1500 Å under vacuum of $10^{-5}$ Torr and at a film forming speed of 20 Å/sec to form a comb-shaped aluminum gap electrode (length 250 μm, width 5 mm). Then, photocurrent (AMI, 100 mW/cm$^2$) and dark current were measured under an applied voltage of 10 V to determine the photoconductivity σp, the ratio of σp (Ω·cm)$^{-1}$ to dark conductivity σd σp/σd for evaluation of a-Si film.

Similarly, the above respective a-Si films were formed by use of $Si_2H_6$ as the chain hydrogenated silicon compound, and σp and σp/σd were determined. The results are shown in Table 1 and Table 2.

TABLE 1

| Si compound | $Si_2H_6$ | |
|---|---|---|
| $CCl_4$ | not employed | employed |
| Substrate temperature | 80° C. | 80° C. |
| σp/σd | $10^3$ | $4 \times 10^3$ |
| σp | $10^{-5}$ | $2 \times 10^{-5}$ |

TABLE 2

| Si compound | $Si_2H_4$ | |
|---|---|---|
| $CCl_4$ | not employed | employed |
| Substrate temperature | 80° C. | 80° C. |
| σp/σd | $5 \times 10^4$ | $10^5$ |

TABLE 2-continued

| Si compound | $Si_2H_4$ | |
|---|---|---|
| $CCl_4$ | not employed | employed |
| σp | $2 \times 10^{-5}$ | $4 \times 10^{-5}$ |

As shown in Table 1 and Table 2, the a-Si films formed with the use of a radical polymerization initiator in accordance with the present invention have good σp and σp/σd values at low substrate temperature, and are yet improved in film forming speed.

As described in detail above, the method for forming deposited film according to the present invention forms a deposited film by using light energy in combination with a radical polymerization initiator, and therefore a silicon deposited film of high quality can be obtained at low substrate temperature and at a high film forming speed.

Also, even in the case of a film to be formed with a broad area and a thick film thickness, uniform electrical and optical characteristics can be obtained. The specific effect not found in the prior art of ensuring stability of the quality can also be exhibited.

Further, since no heating of the substrate to a high temperature is required, there can be exhibited the effects that energy can be saved, that film formation is rendered possible also on a substrate with poor heat resistance, that the steps can be shortened by the low temperature treatment, that the starting compounds can easily be synthesized, and also that the process can be inexpensive, yet excellent in safety and also little in danger in handling.

We claim:

1. A method for forming a deposited film comprising: forming a gaseous atmosphere of a hydrogenated silicon compound of the general formula $Si_nH_m$ wherein n is an integer of 1 or more, and m is an integer of 2 or more, in a chamber housing a substrate therein; introducing a gaseous $CCl_4$ radical polymerization initiator into said chamber and utilizing light energy to thereby excite said compound to effect formation of a deposited film containing silicon on said substrate.

2. A method according to claim 1, wherein said hydrogenated silicon compound is a chain hydrogenated silicon compound wherein n is 2, 3 or 4.

3. A method according to claim 1, wherein said hydrogenated silicon compound is a cyclic hydrogenated silicon compound wherein n is 3, 4 or 7.

4. A method for forming a deposited film comprising: forming a gaseous atmosphere of a hydrogenated silicon compound of the general formula $Si_nH_m$ wherein n is an integer of 1 or more, and m is an integer of 2 or more, in a chamber housing a substrate therein; introducing a gaseous azo compound radical polymerization initiator into said chamber and utilizing light energy to thereby excite said compound to effect formation of a deposited film containing silicon on said substrate.

5. A method for forming a deposited film comprising: forming a gaseous atmosphere of a hydrogenated silicon compound of the general formula $Si_nH_m$ wherein n is an integer of 1 more more, and m is an integer of 2 or more, in a chamber housing a substrate therein; introducing a gaseous radical polymerization initiator into said chamber and utilizing light energy to thereby excite said compound to effect formation of a deposited film containing silicon on said substrate; said radical polymerization initiator being selected from the group consisting of a hydrogen peroxide, R—OOH; a dialkyl peroxide, R—OO—R'; a diacyl peroxide, (R—COO)$_2$ and an ester peroxide, R—COO—R' in which R and R' are each independently alkyl or phenyl.

* * * * *